United States Patent [19]
Trovato et al.

[11] Patent Number: 5,220,497
[45] Date of Patent: Jun. 15, 1993

[54] METHOD AND APPARATUS FOR CONTROLLING HIGH SPEED VEHICLES

[75] Inventors: Karen I. Trovato, Putnam Valley; Sandeep Mehta, Ossining, both of N.Y.

[73] Assignee: North American Philips Corp., New York, N.Y.

[21] Appl. No.: 605,057

[22] Filed: Oct. 29, 1990

Related U.S. Application Data

[63] Continuation-in-part of Ser. No. 442,476, Nov. 22, 1989, abandoned, which is a continuation of Ser. No. 123,502, Nov. 20, 1987, abandoned, and a continuation-in-part of Ser. No. 422,930, Oct. 17, 1989, Pat. No. 5,083,256.

[51] Int. Cl.[5] .................. G06F 15/46; G06F 15/48; G06F 15/18
[52] U.S. Cl. ............ 364/167.01; 364/424.02; 364/461; 364/148; 395/90
[58] Field of Search .......... 364/148, 424.02, 461, 364/436, 437, 438, 444, 167.01, 474.2; 395/80, 85, 88, 90, 919, 89, 905

[56] References Cited

U.S. PATENT DOCUMENTS

| | | | |
|---|---|---|---|
| 4,481,568 | 11/1984 | Inaba et al. | 395/919 X |
| 4,482,968 | 11/1984 | Inaba et al. | 364/474.2 X |
| 4,674,048 | 6/1987 | Okumura | 364/424.02 |
| 4,764,873 | 8/1988 | Libby | 364/461 |
| 4,949,277 | 8/1990 | Trovato et al. | 395/90 |

Primary Examiner—Joseph Ruggiero
Attorney, Agent, or Firm—David Schreiber

[57] ABSTRACT

Maneuvers of a controlled vehicle, such as a car, traveling at moderate to high speeds are planned by propagating cost waves in a configuration space using two search strategies referred to as budding and differential budding. Control is achieved by monitoring properties of the controlled vehicle and adjusting control parameters to achieve motion relative to a frame of reference. The frame of reference may change before the transformation to configuration space occurs. The method transforms goals, obstacles, and the position of the controlled vehicle in task space to a configuration space based on the position of these objects relative to a moving frame of reference. The method also determines a local neighborhood of possible motions based on the control capabilities of the vehicle. In one embodiment, the controlled parameters are time derivatives of the monitored properties. A variation of the method provides for the parallel computation of the configuration space. In one embodiment of the parallel computation, the case where two processes are used, a first process and configuration space would be used to plan. A second process and configuration space would be used to read the setpoints which are sent as control directives to the vehicle.

18 Claims, 7 Drawing Sheets

METHOD AND APPARATUS FOR CONTROLLING HIGH SPEED VEHICLES

RELATED APPLICATIONS

This is a continuation in part of U.S. application Ser. No. 07/442,476 filed Nov. 22, 1989 (now abandoned) which is a continuation of U.S. application Ser. No. 07/123,502 filed Nov. 20, 1987 (now abandoned) and is also a continuation in part of U.S. application Ser. No. 07/422,930 filed Oct. 17, 1989, now U.S. Pat. No. 5,083,256.

BACKGROUND OF THE INVENTION

1. Field of the Invention

The invention relates to planning and controlling the motion of an object and in particular to path planning in a highway environment.

2. Related Art

The field of path planning is one with many applications. In the prior art, the most common application is for controlling robots. Other applications include electronic maps, traffic control, emergency vehicle control, emergency exit systems and vehicle maneuvering.

The path planning problem, as applied to robots, typically involves choosing a path to get a robot from a start point to a goal point while avoiding obstacles. Automatic multidimensional path planning for robots is one of the great historical problems of robotics.

The disclosure of U.S. Pat. No. 4,949,277 is incorporated herein by reference. The prior art discloses, amongst other things, propagating cost waves through a configuration space by budding, using a space-variant metric.

Budding finds the optimal path from all starting states to the nearest goal state in a configuration space. A configuration state can be described by a tuple. A tuple is a list of valued parameters. The parameters are always given in a specific order so that an implicit correspondence can be made between the list of values and the associated parameters. For example, an x, y tuple is typically written as [2,4] or alternatively, (2,4). In this case, the value of 'x' in the tuple is 2, and the value of 'y' is 4. The configuration space is typically the span of tuples. Tuple, also defines as a 'setpoint'. For example, the (2,4) tuple may represent the offset measures from the origin of: 2 meters away in the 'x' direction, and 4 meters away in the 'y' direction. The configuration space is therefore a discretized range of values for each of the parameter in a device. A cost metric is imposed on the configuration space. This cost metric determines the transition cost of moving from one state to another state. In some cases, it may be 'illegal' or highly undesirable for the device to be in a particular configuration state. These states are referred to as 'obstacles' and have a very high, or infinite transition cost from any other state. A 'neighborhood' describes the capabilities of the device. The neighborhood gives the permissible state changes from a given state. Budding starts at the goal or goals, and expands adjacent nodes least-total-cost-first. A graphical view of the order of expansion gives rise to the 'wave propagation' term. By propagating waves cost-first the configuration space is also marked in the order of expansion with 'direction arrows' which point back to the least cost path at each configuration state. From a starting state, the goal is reached by following the 'direction arrows' from state to neighboring state until the goal state is reached. The goal state has no direction arrows. By reading out the tuples representing the state, the device can be controlled. This is typically performed by sending the 'setpoints' to the device's controller.

After budding, some aspect of the configuration space may change, for example, if an obstacle or goal is added or removed. In such a case, it may be inefficient to bud the entire configuration space again because only a small part of the configuration space may be affected.

'Differential budding' has been extended to handle not only added or removed goals and obstacles, but also the individual transitions between states.

The 'budding' and 'differential budding' methods have been used to control the maneuvers of a robotic vehicle. In this case, the configuration space of the vehicle is described in terms of the position and orientation of the vehicle relative in a fixed world position. In this way, the path planner generates 'setpoints' of position and orientation which the vehicle can then carry out.

SUMMARY OF THE INVENTION

The maneuvers of a controlled vehicle, such as a car, traveling at moderate to high speeds are planned by computing the motion of the controlled vehicle relative to a frame of reference which is moving relative to the physical surroundings. An example is a higher speed automobile moving in traffic on a highway. The frame of reference may move with the same value of monitored property as the controlled vehicle. For example, the frame of reference may have the same velocity as the controlled vehicle. The frame of reference may also move with the same value of the monitored property of one of the obstacles. The maneuver is optimal given the surrounding obstacles, and the control capabilities of the vehicle. Examples of optimum maneuvers that can be computed are for minimal fuel use, and minimum distance travelled. Selected properties of the controlled vehicle and frame of reference are monitored, typically by sensors. These properties are usually physical attributes such as relative position and, relative velocity. The controlled parameters, i.e. the mechanisms to affect change in the system, are the time derivatives of the monitored properties. For example, acceleration or deceleration is required to change the monitored velocity of a vehicle. This may be achieved with one or more actuators in the vehicle, such as reducing pressure on the accelerator peddle while simultaneously applying the brake. The path describing the maneuver is generated using 'budding' or differential budding which produces a series of setpoints. The vehicle is controlled by moving to each new setpoint using the control capabilities.

It is an object of the invention to plan a path for a vehicle described in a configuration space of relative positions.

It is a second object of the invention to have the neighborhood of possible motions describe velocity changes.

It is a third object of the invention to generate control 'setpoints' of velocity.

It is a fourth object of the invention to transform obstacles in terms of physical shape adapted to the stopping distance of the controlled vehicle.

It is a fifth object of the invention to use parallel means for a) sensing and planning, and b) controlling such that a vehicle can maneuver at higher speeds.

BRIEF DESCRIPTION OF THE DRAWING

These and other aspects of the invention are described herein with reference to the selected embodiments illustrated in the following figures.

DESCRIPTION OF THE PREFERRED EMBODIMENT

Application of Budding and Differential Budding to Maneuvering a Vehicle at Higher Speeds Budding and differential budding are used to maneuver a robotic vehicle at higher speeds. "Higher speeds" is used herein to mean speeds sufficient so that small movements of the steering wheel produce nearly transverse motion relative to another moving object. For situations where the vehicle is moving at higher speeds, the orientation of the vehicle need not be used, making the path planning process faster.

Figure 1:
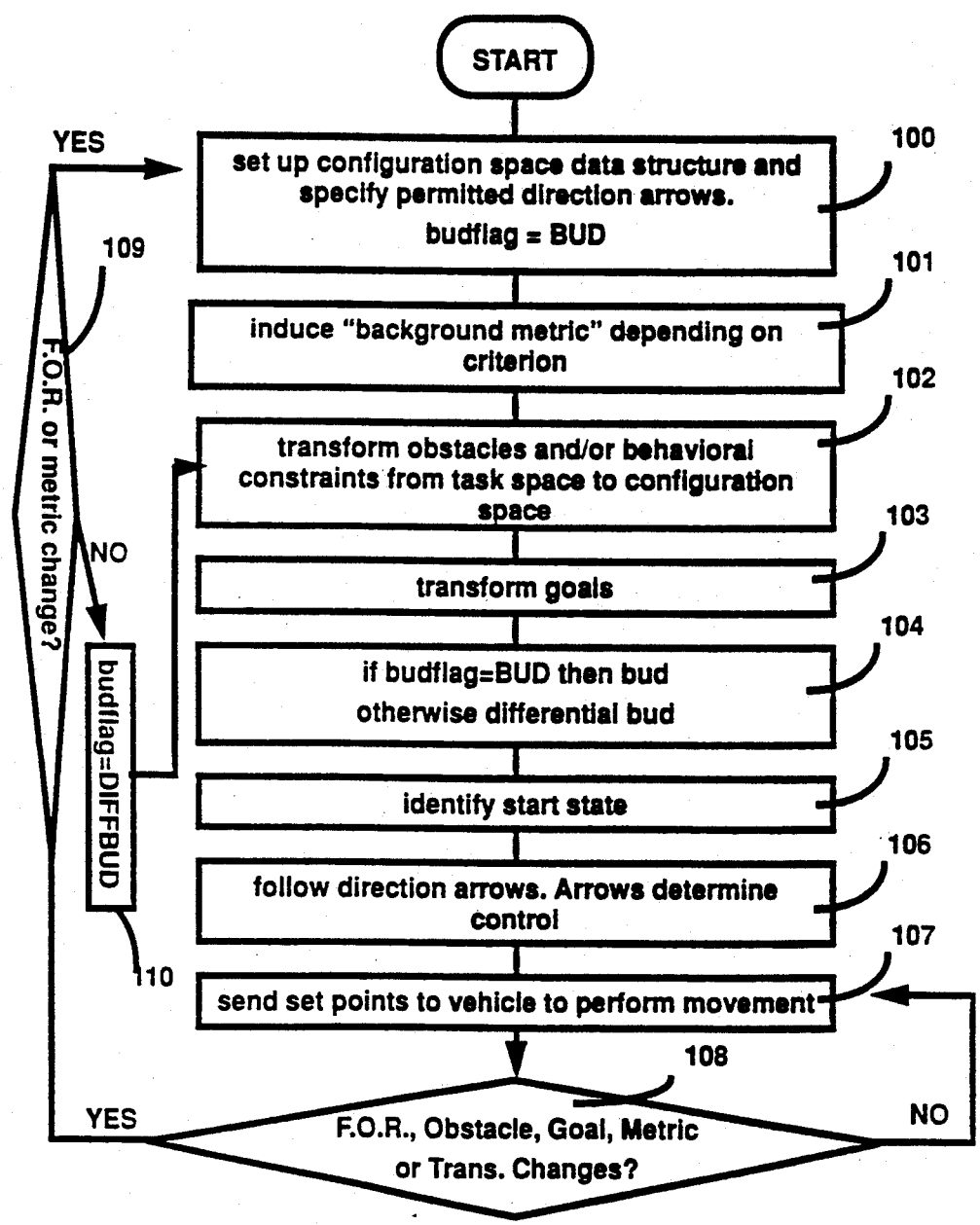
FIG. 1 is a flowchart of a method for controlling vehicle maneuvers at higher speeds.

In FIG. 1, details of an embodiment are given in flowchart form. This flowchart gives the steps involved in controlling a vehicle where the vehicle is travelling at higher speeds. Configuration space is set up based on sensory data, a path is planned and the vehicle is controlled to follow the path. The process is repeated whenever new sensory information is incorporated.

In box 100, a 'monitored property' is chosen. An example of a 'monitored property' is velocity. Alternately, the 'monitored property' could be acceleration, but other dynamic properties, could be used instead. This monitored property is one which can be sensed each time the plan is updated. Integral properties and first derivatives can be generated from each monitored property. For example, if the monitored property is the velocity of a vehicle, then the relative distance, and acceleration over a period of time, can also be calculated from velocity measurements. One or more monitored properties may be needed to control a vehicle. For example, in addition to the velocity of the controlled vehicle and the frame of reference, the absolute lateral distance of the controlled vehicle and the frame of reference could be monitored.

Also in box 100, the configuration space is set up in terms of relative distance. First, a frame of reference, herein abbreviated as F.O.R., is determined. The frame of reference commonly is considered to be at the origin in terms of relative measurements, although other origins could be used as well. This is usually a moving vehicle at the limit of the controlled vehicle's sensory capability. It may also be a focal point on the road, a fixed distance from the controlled vehicle. Based on new sensory data, a new frame of reference may be determined at any time after a first plan is computed. For example, as the controlled vehicle overtakes the furthest sensed car, a new second furthest sensed car may be determined to be the new frame of reference. Other causes may change the frame of reference, such as the frame of reference falling from view over a hilltop, wherein a closer frame of reference will be used. A frame of reference may be lost from view if it leaves headlight view at night, or if it turns off the highway.

The 'monitored properties' of both the frame of reference and controlled vehicle are sensed. By sensing, we mean any form of data acquisition to determine the state of the frame of reference and controlled vehicle. For example, the controlled car may be travelling at a velocity of 30 m.p.h. 500 feet behind a frame of reference which is travelling at a velocity of 25 m.p.h. in the same direction.

The relative position of the controlled vehicle is then the derived distance between the frame of reference and the controlled car. In the example above it is 500 feet.

The discretized configuration space, calculated in Box 100, should be large enough to envelope both the frame of reference and the controlled vehicle. Although it is sufficient to have the configuration space range from the controlled vehicle distance to the frame of reference, it is preferred that larger areas be considered as an allowance for the time lag in the feedback system used to control the car.

The two state indicator budflag, with states BUD and DIFFBUD, is set to BUD.

In box 101, a background metric is established. This is done by establishing the reachable neighborhood of nearby states, and assigning a cost to those motions. The capabilities of the controlled vehicle define the transitions. For example, a racing car's engine will determine the acceleration that it may achieve in one unit of time. In a configuration space defined by a moving frame of reference, acceleration greater than the frame of reference results in a forward motion relative to the frame of reference. The capabilities of the vehicle can also take into account the 'rules of the road'. For example, a car may be capable of accelerating to 100 mph, but the 'rules of the road' restrict the vehicle velocity to 55 mph. Another example capability is based on occupant comfort and could limit acceleration or deceleration to 5 m.p.h. over 2 seconds. Thus, if the "next state" defines where the vehicle will be in 2 seconds, then there would be a transition increasing or decreasing the speed by 5 mph. The x,y positions resulting from the transitions describe the neighborhood. In the preferred embodiment, the transitions represent motions which are the first derivative of the monitored property. Using the previous example, if the monitored property is velocity, then by monitoring the velocities of the frame of reference and controlled vehicle over a short period of time, the desired acceleration can be computed.

This short period of time must be measurable and may vary or be fixed and is herein referred to as the 'planning cycle time'. In the preferred embodiment, the planning cycle time is the time it takes to compute the desired path.

A cost must be assigned to each possible transition. The cost is the expense of making a move from one state in the configuration space to the neighboring state. An example of a cost is the fuel used in making the transition. Another example of a cost is the time elapsed.

In box 102, obstacles are transformed into the configuration space. Obstacles in configuration space represent illegal states of the vehicle. Illegal states can be caused by geometrical obstructions. An example of a geometrical obstruction is a state corresponding to the positions where a vehicle physically hits or intersects the body of another vehicle.

A second type of illegal state can be caused by 'rules of the road'. For highway maneuvers, the double yellow line is a border not to be crossed. This border becomes a 'virtual wall'. The configuration states representing intersections of the 'virtual wall' and the controlled vehicle's body are thereby illegal states.

A third type of illegal states can be caused by adaptive constraints. A adaptive constraint may be a constraint determined based on the physics, current state and 'monitored property'. One example might be 'stopping distance' used for safety reasons. In the preferred embodiment, configuration states representing the controlled vehicle at a distance less than the 'stopping distance' from obstacles are illegal states. The 'stopping distance' is commonly defined as the braking distance plus the reaction distance. Reaction distance is how far a vehicle travels during the time it takes the controller to respond to a hazard and activate the brakes. The sensing time plus the cycle time is used to compute the reaction time and reaction distance. Braking distance is how far a vehicle travels from the moment the brakes are activated until it comes to a stop. Other forms of halting or slowing the vehicle could be used rather than standard brakes. An example of alternatives to brakes is slowing a direct drive motor in an electric car.

In box 103, the goal or goal states are transformed to the configuration space. They can be chosen in many ways. One way is to describe a 'general goal' and decompose it into smaller subgoals. The Robot Schema facility (Lyons, D. M. and Arbib, M. A. *A Formal Model of Computation for Sensory-Based Robotics*, IEEE Transactions on Robotics & Automation, Vol. 5, No. 3 June 1989 pp. 280-293) teaches sophisticated ways to decompose goals into subgoals. An example of a goal is to 'pass the car in front'. This may map into several goal states. The task space goal in this example would be 'in front of the car in front of the controlled vehicle', and 'to the front and left of the car in front of the controlled vehicle'. The configuration states corresponding to these positions are examples of goal states.

In box 104, budding or differential budding is performed. If budflag is set to BUD, then budding is performed. If budflag is set to DIFFBUD, then differential budding is performed. Although budding could always be used to find a new solution from scratch, the preferred approach is to use differential budding when obstacles, goals, or transitions change, because it yields a faster solution, and provides control directives while recomputation is occurring if the affected region does not include the current controlled state.

In box 105, the relative current starting position must be transformed into the starting state in configuration space. The position is measured between the frame of reference and the controlled vehicle. The values of the position give the starting configuration state.

In box 106, gradient following occurs. As taught in the prior art, transitions can be followed from state to state to the goal. The transitions are decomposed into control parameters. For example, a direction arrow may correspond to moving 'forward' toward the frame of reference. In this example, such a desired motion may correspond to accelerating by 5 mph.

In box 107, setpoints, as defined by the control parameters described in the direction arrows, are sent to the vehicle. One or more setpoints may be sent to the vehicle. One possible control might be the voltage controlling the fuel sent to the fuel injection system. In the preferred embodiment, the change in voltage used to increase velocity may not be the same as the change in voltage used to decrease velocity. For example, if the vehicle is to accelerate 5 mph, the voltage may increase 0.2 volts. Alternatively, if the vehicle is to decelerate, the voltage may decrease 0.5 volts, while a electronic braking mechanism is activated.

The arrow out of Box 107 leads to a decision box, 108. This box tests if the frame of reference, obstacles, goals, cost metric, or transitions have changed. For example, a metric representing a vehicle's maximum acceleration may change due to decreased traction in suddenly poor weather, or the gravity effects of an increase in road grade. Another example when the metric may change is in areas where the 'rules of the road' change, such as a lowering of the speed limit in a construction zone. If they have not, then the NO arrow is followed to box 107 and control continues. If either the frame of reference, obstacles, metric or single transitions change, then replanning is required, and the YES arrow is followed to decision box 109. If either the frame of reference, or the metric have changed, then the YES arrow is followed back to box 100. Otherwise, one or more goals, obstacles, or transitions have changed, and the NO arrow can be followed to box 110.

Box 110 sets the budflag to DIFFBUD. After box 110, the process in box 102 is performed.

Alternate Embodiment

To obtain better performance, it may be desirable to have two processes working in parallel to control the car. In the case where two processes are used, a first process and configuration space would be used to plan. A second process and configuration space would be used to read the setpoints which are sent as control directives to the vehicle. After the planner finishes work on a first copy of the configuration space, herein referred to as a 'planning copy of configuration space', a duplicate is made, herein referred to as a 'control copy of configuration space'. This control copy of configuration space is unchanged until the next full copy of configuration space is delivered by the planner. This method allows the control of the vehicle to continue without the delay that otherwise might occur while the planner is planning.

Figure 2:
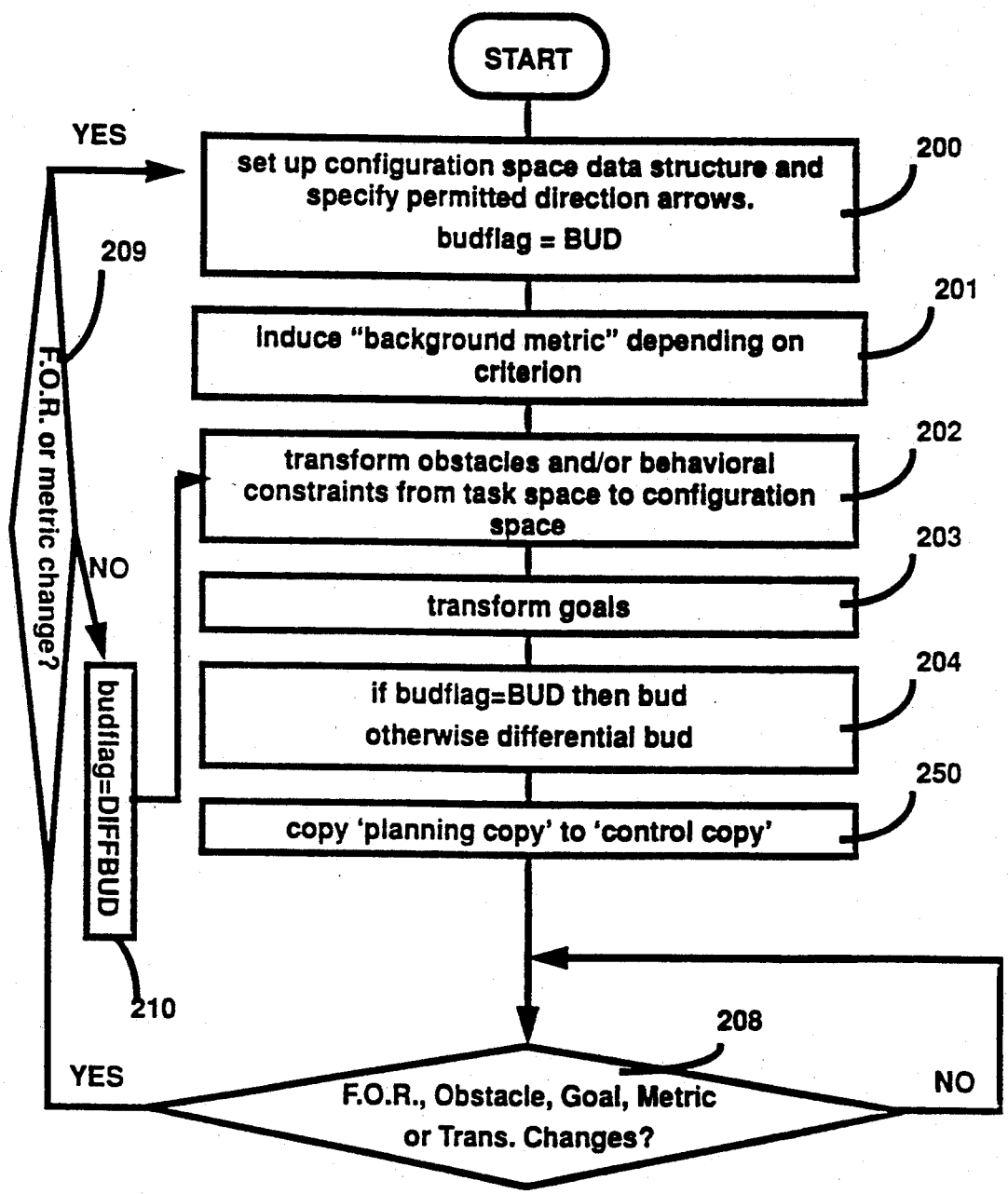
FIG. 2 is a flowchart of a planning process to be used in parallel with the control process of FIG. 3.
Figure 3:
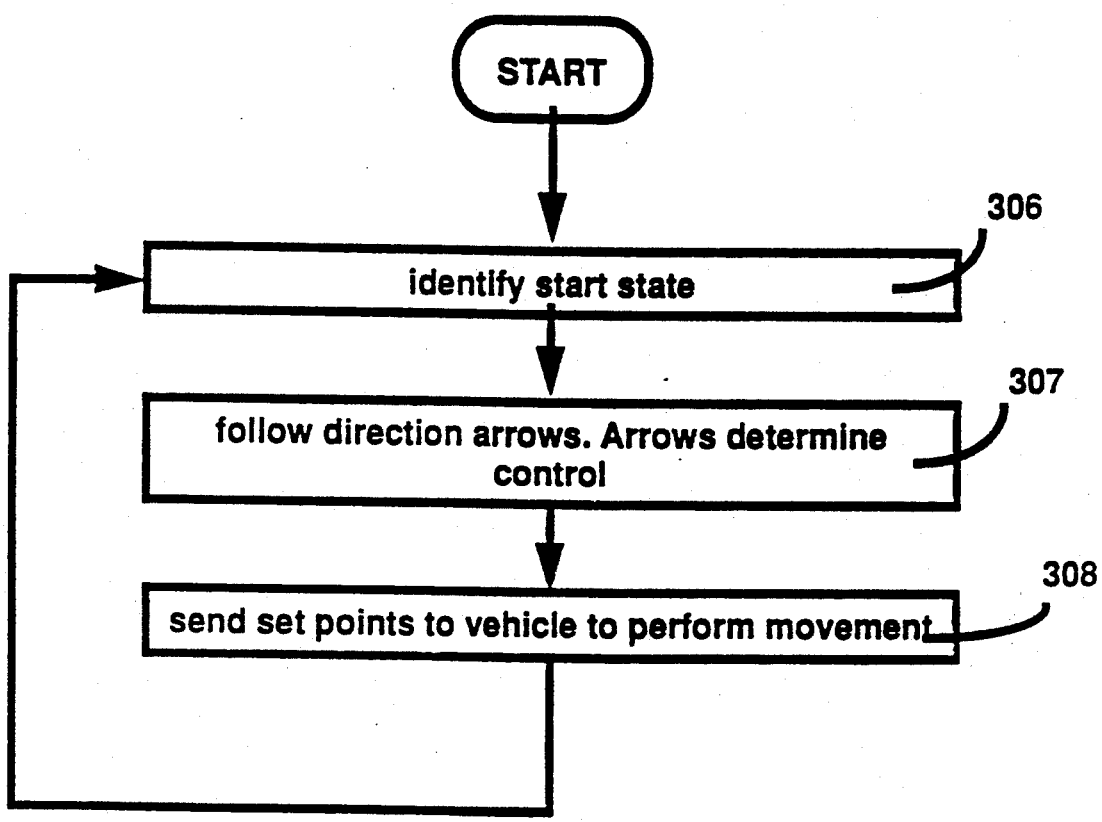
FIG. 3 is a flowchart of a control process to be used in parallel with the planning process of FIG. 2.

In FIGS. 2 and 3, details are given in flowchart form. These flowcharts give the steps to control a vehicle travelling at higher speeds using a parallel processing system. Although this flowchart describes how two processes can operate in parallel to control the car, one skilled in the art will recognize ways to further parallelize these processes using three or more processes. FIG. 2 describes the method for planning. FIG. 3 describes the method for control.

FIG. 2 contains a stepwise flowchart description of the planning process. When the process in FIG. 2 runs in parallel with the control process of FIG. 3, and has the ability to alter the 'control copy of configuration space' needed by the control process of FIG. 3, the vehicle can be controlled.

In FIG. 2, boxes 200, 201, 202, 203, and 204 are similar to boxes 100, 101, 102, 103, and 104 respectively, in FIG. 1. The differences in FIG. 2 are in box 250, 208, 209, and 210.

Box 250 follows box 204.

In box 250, the finished 'planning copy of configuration space'is duplicated. The second copy is herein renamed 'control copy of configuration space'. Decision box 208 follows box 250.

Box 208 tests if the frame of reference, obstacles, goals, or transitions have changed. If they have not, then the NO arrow is followed back to box 208. If the frame of reference, obstacles, goals, metric or transitions change, then replanning is required, and the YES arrow is followed to decision box 209. If either the frame of reference, or a cost transition has changed, then the YES arrow is followed back to box 200. Otherwise, one or more goals, obstacles, or transitions have changed, and the NO arrow can be followed to box 210.

Box 210 sets the budflag to DIFFBUD. After box 210, the process in box 202 is performed.

FIG. 3 contains a stepwise flowchart description of the control process.

In box 306, the relative current position must be transformed into the starting state for the 'control copy of configuration space'. The position is measured between the frame of reference and the controlled vehicle. The values of the position give the starting configuration state.

In box 307, the direction arrows are followed. In the same way as the prior art, direction arrows could be followed state to state to the goal. The direction arrows are decomposed into control parameters.

In box 308, the control parameters, which are described in terms of the original capabilities, are sent to the vehicle. The method continues to box 306.

Example of Maneuvering a Vehicle at Highways Speeds

In what follows, an example is given of the application of budding and differential budding to maneuvering a robotic vehicle at higher speeds. The example is of an ordinary vehicle with front wheel steering.

The vehicle at higher speeds can be regarded as a robot with two degrees of freedom. Two parameters (x,y) will be used herein as axes of a configuration space for the car, where x and y define a location of the car in Cartesian coordinates.

Figure 4:
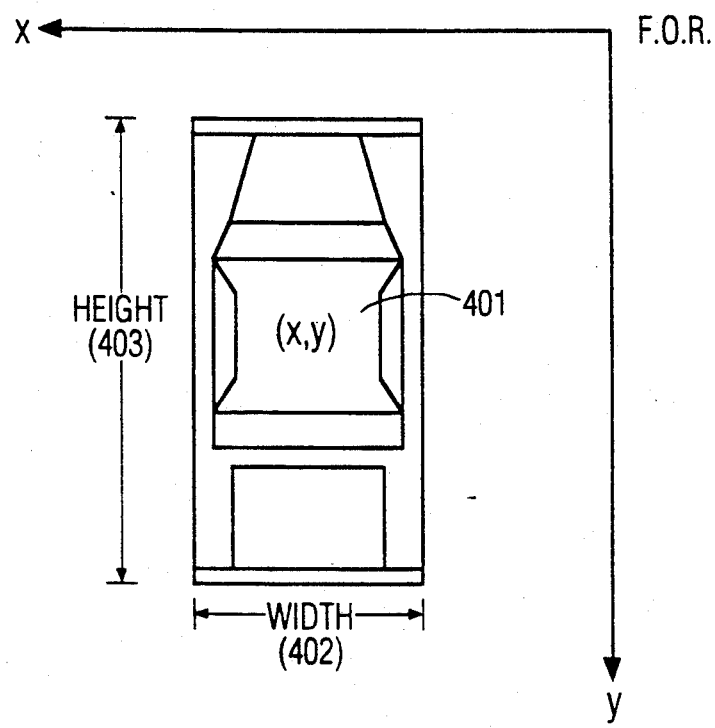
FIG. 4 shows an example configuration of a high speed vehicle relative to a frame of reference.

In FIG. 4, the "Cartesian point location" of the car (x,y) shown by point 401, is taken to be at a point in the center of the vehicle. However, any point consistently related to the position of the car may be chosen. In addition to having a point location, the vehicle is assumed to be contained within a rectangle having a width and length, denoted by 402 and 403 in FIG. 4.

Figure 5:
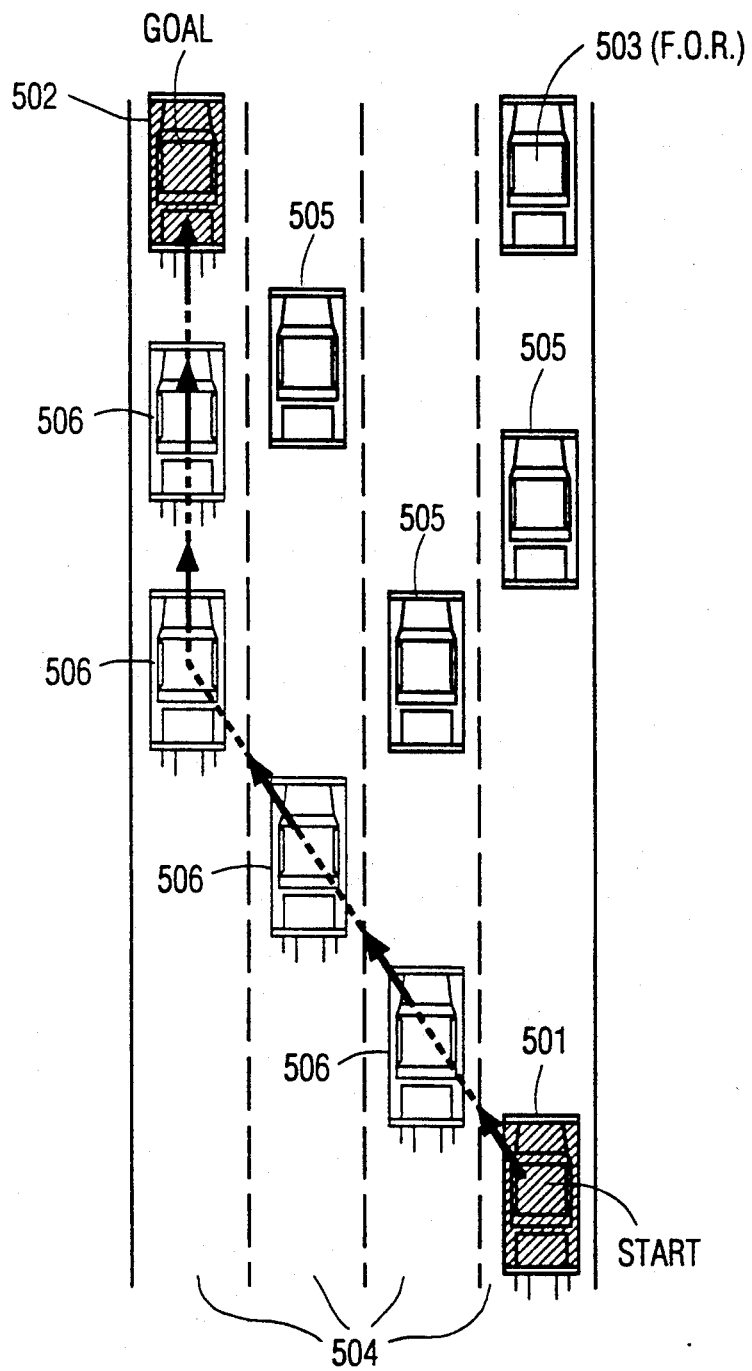
FIG. 5 shows an example of a high speed vehicle in task space.

The FIG. 5, illustrates an example highway scenario. The highway has four lanes denoted as 504. The number of lanes can vary in a different example. There are two types of objects on the highway shown in FIG. 5. There are three obstacle vehicles denoted as 505. The number of obstacle vehicles on the highway can also vary in a different example. The controlled vehicle is shown at its starting state denoted as 501. The desired goal state in which we intend the vehicle to reach is denoted as 502.

The Frame of Reference (F.O.R.) is denoted as 503 in FIG. 5. In this example, the vehicle at the lead of traffic is denoted as the frame of reference and is the furthest vehicle that can be readily sensed by the controlled car, 501. The sensory data is collected to report the positions of all of the vehicles in traffic relative to the sensed position of the frame of reference vehicle. In this simplified example, all obstacles vehicles are travelling at a fixed speed of 35 m.p.h. and continue to do so while the later planning calculation takes place. The controlled vehicle, 501, is travelling at an initial speed of 25 m.p.h. in the far right lane shown in FIG. 5. Controlled vehicle 501 is at a fixed forward distance of 500 feet behind the first obstacle also in the same lane. The goal is for controlled vehicle 501 to reach position 502, ahead of all the obstacle vehicles. The goal has to be achieved within the 'rules of the road' and without interfering with the obstacle vehicles.

According to FIG. 2, which illustrates a flowchart of the planning method, we first select the monitored property (box 200). In this example the monitored property is the speed of the controlled vehicle 501. Box 201 requires setting up the configuration space. The chosen frame of reference (F.O.R.) is denoted as 503 in FIG. 5. The frame of reference is also a 'Cartesian point location' (x,y). Given the locations of the controlled vehicle (501) and the frame of reference (503) the position of the controlled vehicle relative to the frame of reference is calculated. The built-in sensors provide the values of the controlled device's properties. With this information, the configuration space is created.

Figure 7:
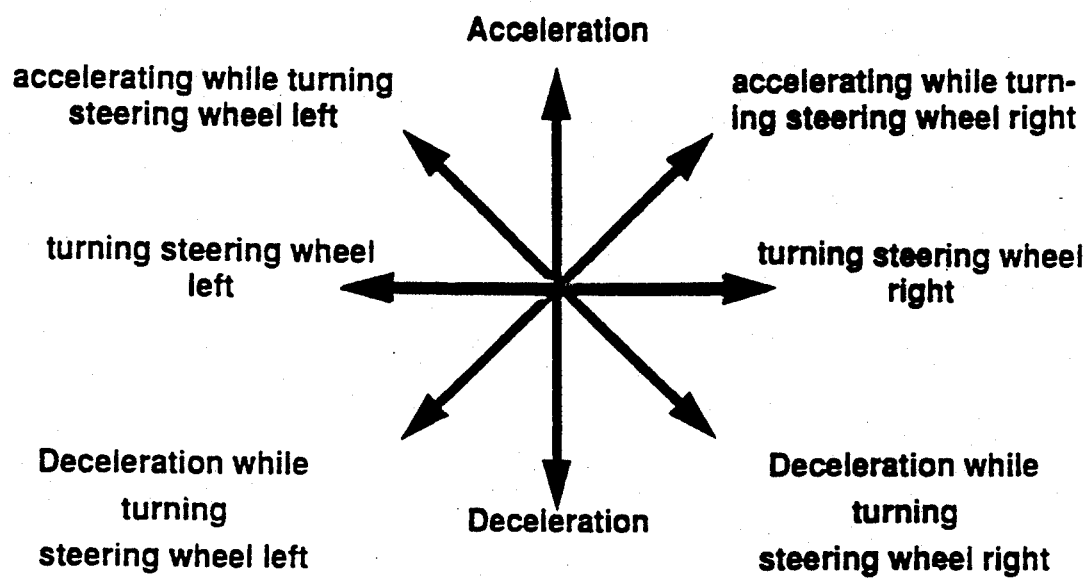
FIG. 7 shows an example neighborhood for a high speed vehicle moving relative to a frame of reference.

Box 202 of the planning flowchart requires the neighborhood to be defined. FIG. 7 shows the neighborhood. The neighborhoods in the prior art typically were described in terms of the reachable positions, and were often absolute positions. The reachable positions in this case are described by the vehicle's capabilities. Since the frame of reference is moving forward in this example, then the reachable positions in the vicinity of the controlled vehicle are limited by the acceleration of the car, to advance toward the frame of reference, deceleration of the car to increase the distance relative to the frame of reference, and left and right movement of the steering wheels to achieve horizontal movement to the left and right relative to the frame of reference. In this example N directions are shown. The forward and reverse directions in the neighborhood are also depicted. Because the monitored property is speed, the neighborhood, which is the first derivative with of the monitored property with respect to time, is acceleration. Thus the cost over the neighborhood is defined in terms of the vehicle's position in (x,y) and it's acceleration.

Figure 6:
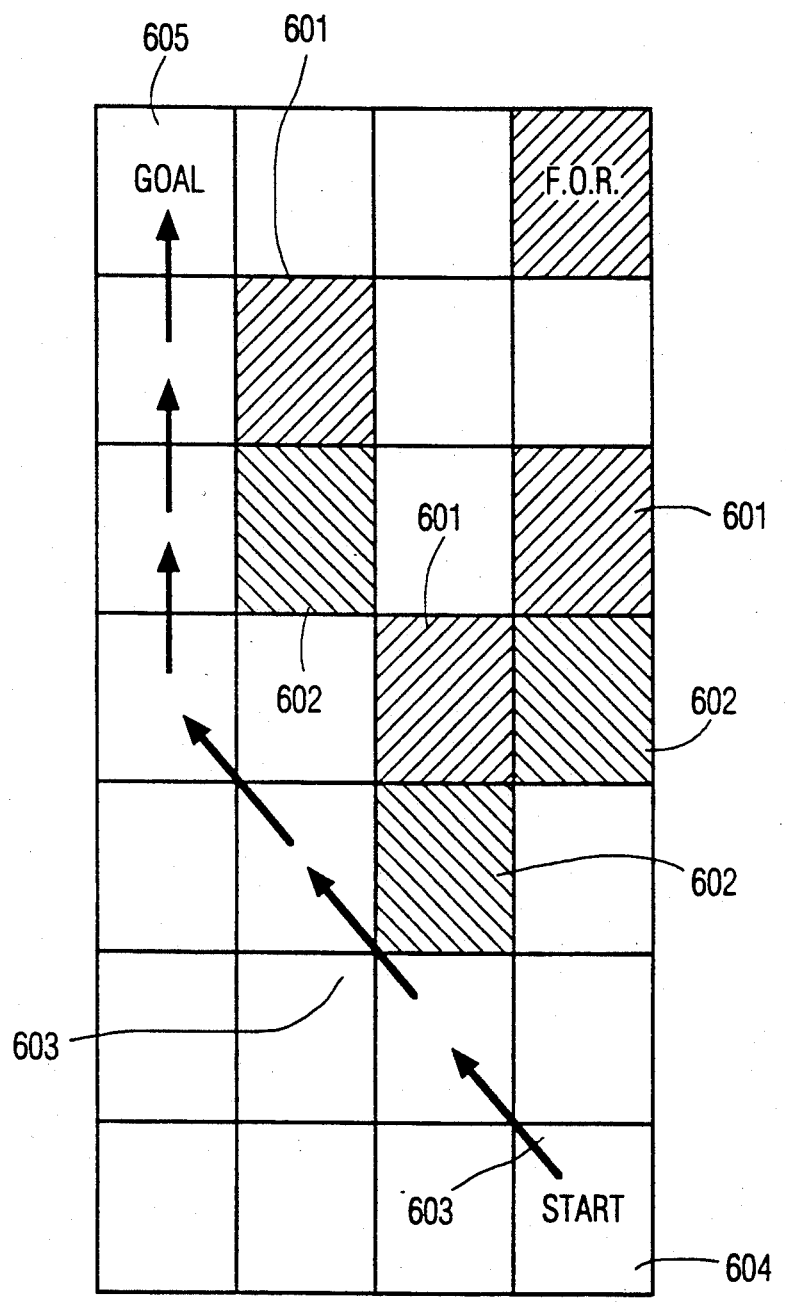
FIG. 6 shows the configuration space equivalent of the task space of FIG. 5.

Box 203 in FIG. 2, involves transforming the obstacles. Because the highway is a dynamic environment, the transformed obstacles include the body intersection as well as a margin of safety called the 'stopping distance'. In our example, the margin of safety is assumed to be the same size as the obstacle. FIG. 6 shows the transformed obstacles and the transitions the controlled vehicle makes to reach the goal. In FIG. 6, the obstacles are the solid boxes depicted as 601, and the margin of safety for each obstacle are the gray boxes depicted as 602. Box 204 involves determining the goal state in configuration space. The start and goal states are shown as 604 and 605 respectively in FIG. 6. All obstacles are transformed to occupy certain regions of configuration space. These regions are forbidden to the controlled device. The next step, box 205, propagates waves. Differential budding is used if budflag is equal to BUD. The planning copy of configuration space is copied to the control copy in box 250. If there are any changes to the goal, metric or transformation then the step in box 203 onwards are repeated, otherwise if there are changes in the frame of reference or metric then all steps from box 201 onwards are repeated.

The actual changing of the controlled vehicle's controlled parameter, i.e., velocity, is shown by the control method illustrated in FIG. 3. First, the vehicle's properties are transformed into configuration space as indicated by box 306 in FIG. 3. The controlled vehicle is at the starting state. The next step, shown in box 307, requires following the gradient using the control parameters provided by the neighborhood and the setpoint provided by the state. Once the configuration space has been budded, the planner can follow the neighborhood arrows along the path of minimum cost to the goal state. To achieve the change, the control parameters are sent to the control mechanism of the vehicle between setpoints. This following has to be continued until the goal state is reached. In FIG. 5, the change in state is shown by the arrows depicted.

From basic physics it is known that at the current speed of 25 m.p.h., the controlled vehicle 501, in FIG. 5, will continue to lose distance from the obstacles vehicles. The monitored property, velocity, has to increase to enable controlled vehicle 501 to reach goal 502. If the controlled device has to gain a fixed distance over the obstacles then the speed parameter has to be increased with respect to time, i.e., the controlled vehicle need to accelerate. The time that vehicle 501 takes to gain that distance is a function of its driving parameters and 'rules of the road', for example observing the speed limit of 55 m.p.h. This allows the derivation of a minimum amount of time necessary to reach the goal state 502 as computed using laws of physics. Furthermore, if any of the observed parameters, such as the speed of obstacles 505, increase then the controlled device has to monitor that property and alter the state of obstacle in the configuration space. This involves repeating steps in boxes 203 to 250 in FIG. 2. In the example illustrated in FIG. 5, the arrows, denoted as 506, denote the transitions required by the controlled device 501 before it can reach the goal state 502. Each transition from start to goal state is achieved by a combination of adjusting the (x,y) positions.

Other Applications

The vehicles so far have been focused on highway-like applications. However other types of vehicles in different scenarios can also be controlled using the same method. For example, the method also has applications in marine situations, such as submarine navigation. Submarine navigation is assisted by radar, sonar, and charts of the ocean waterbed and currents. As an example, the frame of reference may be a ship overhead, or another submarine. In this situation, the goal may be to move a fixed offset distance from the frame of reference. In addition to static obstacles, such as the ocean bed, other factors, such as the water current can be factored into the cost metric.

Another marine application is the piloting of large marine vessels into difficult seaports, for example, seaports in which the depth may not be sufficient for all vessels, and the waterbed topology is continuously changing because of sand bars, tides etc. Ship pilots have to continuously monitor the waterbed and port traffic while guiding the vessel to its allocated dock. In this case the frame of reference may be specific vessel which could be moving and requires the controlled vessel to track it and stay a fixed distance relative to it. On a slower time scale, the frame of reference could be a geographical feature of the seabed, such as a drifting sand bar, which the vessel must avoid, based on short term sensory information.

A sub-application of the sandbar scenario is when there are multiple sand bars that the controlled vessel must avoid. In other words, the open channel between two sand bars becomes the moving target that the controlled vessel is aiming for. Of course, there could be a succession of such moving targets (i.e., open channels) before the vessel reaches its goal, i.e., the dock.

The fishing industry needs to use tracking technology to home in on bodies of water well populated by schools of fish. Since fish move continuously with varying weather and feeding conditions, using schools of fish as a frame of reference by the controlled vessel, i.e., the fish trawler can help them plan their fishing route better thus increasing their fish yield.

The highway-like analogy can also be applied to other domains such as air-traffic control. In this case we are dealing with guiding aircraft in 3 dimensional space, say over an airport. The objective is for the aircraft to avoid other aircraft and maintain the holding pattern allocated to them. They are allowed a very wide margin for safety reasons. Depending of traffic load, runway and weather conditions the landing aircraft can make use of path planning technology to augment their guidance systems. In a holding pattern an aircraft would use aircraft in neighboring patterns as the frames of reference to maintain correct position and alter the position or frame of reference as the situation changes. Using a ground based beacon may not be appropriate in all situations if other aircraft in the area are not doing exactly the same thing. The same technology may be used by air traffic controllers below to define paths for take-off and landing aircraft with the same parameters factored into the cost-metric.

Another area of application is where two or more machines operate in 'formation'. One example is where two plows work in tandem to clear snow from the road. The lead plow is the frame of reference, and the trailing plow is the controlled vehicle. Alternatively, farming machines that work together can be controlled in a similar way. Large farms require large collections of machines to work together. For example, a controlled farm machine that cuts the crop may be followed by a second controlled farm machine that collects and bundles the crop, followed by a third controlled farm machine that clears the field of debris and unused parts of the crop. In this case, the first controlled farm machine might use the position of the end of the row as a frame of reference, the second controlled farm machine could use the first farm machine as a frame of reference, and the third machine could use either the first farm machine or the third farm machine as a frame of reference. A formation of machines including one or more varieties of machine can also be one component of a larger machine formation. For example, a larger machine formation of farming machines would have two or more of the three-farm-machine formations operating on parallel rows in a field.

We claim:

1. A method for controlling the motion of a vehicle in a physical task space comprising the steps of:

generating a data set which represents a configuration space having a frame of reference which is moving relative to the physical space;

propagating cost waves in the configuration space data set to create direction arrows;

using the direction arrows to find a least cost path from a starting point to a goal point in the physical task space; and controlling one or more parameters affecting the motion of the vehicle after finding the least cost path in a manner that the vehicle follows the path.

2. The method of claim 1 wherein the step of generating the data set comprises monitoring one or more properties of the vehicle.

3. The method of claim 2 wherein the controlled parameters are the time derivatives of the monitored properties.

4. The method of claim 3 wherein the monitored properties are velocity components of the vehicle and wherein the controlled parameters are the acceleration components of the vehicle.

5. The method of claim 1 further comprising the steps of repetitively:
updating the data set to reflect changes in the task space and or properties of the vehicle;
repropagating cost waves in the configuration space data set to update the direction arrows; and
modifying the path on the basis of the updated direction arrows.

6. The method of claim 5 wherein the step of propagating the cost waves comprises budding waves in the configuration space and wherein the step of repropagating the cost waves comprises differentially budding waves in the propagation space.

7. The method of claim 6 wherein the step of repropagating cost waves comprises:
determining if a metric has changed in the configuration space;
budding waves in the configuration space if the metric has changed; and
differentially budding waves in the configuration space if the metric has not changed.

8. A method for controlling the motion of a vehicle in a physical task space comprising the steps of:
1) generating a first data set which represents a first configuration space having a frame of reference which is moving relative to the physical space;
2) propagating cost waves in the configuration space data set to create first direction arrows;
3) using the first direction arrows to find a least cost first path from starting point to a goal point in the physical task space; and
4) controlling one or more parameters affecting the motion of the vehicle after finding the first least cost path in a manner that the vehicle follows the first path
5) while controlling the parameters in accordance with step 4):
generating a second data set which represents a second configuration space having a frame of reference which is moving relative to the physical space;
propagating cost waves in the second configuration space data set to create second direction arrows;
using the second direction arrows to find a least cost second path from a starting point to a goal point in the physical task space; and then
6) controlling one or more parameters affecting the motion of the vehicle so that the vehicle follows the second path; and then
7) alternatingly repropagating cost waves and finding paths in the first and second data sets while controlling the parameters on the basis of the last most recently determined path.

9. The method of claim 8 wherein the step of generating the second data set includes copying the first data set into the second data set.

10. The method of any of claims 2, 5, or 8 wherein the least cost path is a path which minimizes fuel use.

11. The method of any of claims 2, 5, or 8 wherein the least cost path is a path which minimizes distance travelled.

12. The method of claim 1 wherein the frame of reference moves with the same velocity as the controlled vehicle.

13. The method of claim 1 wherein the path is determined to avoid collisions with obstacles which are moving relative to the task space and the frame of reference moves with the same velocity as one of the obstacles.

14. The method of claim 1 wherein the vehicle is an automobile or the like moving at higher speed and the task space includes a highway.

15. The method of claim 1 wherein the vehicle is a submarine tracking another ship, while avoiding the ocean bottom and other obstacles.

16. The method of claim 1 wherein the choice of frame of reference changes due to changes in sensory information.

17. The method of claim 12 wherein the controlled vehicle is one of a plurality of vehicles moving in formation.

18. A system for controlling the motion of a vehicle in a physical task space comprising:
means for generating a data set which represents a configuration space having a frame of reference which is moving relative to the physical space;
means for propagating cost waves in the configuration space data set to create direction arrows;
means for using the direction arrows to find a least cost path from a starting point to a goal point in the physical task space; and
means for controlling one or more parameters affecting the motion of the vehicle in response to the means for using the direction arrows in a manner that the vehicle follows the path.

* * * * *